(12) United States Patent
Hashimoto et al.

(10) Patent No.: US 6,722,954 B2
(45) Date of Patent: Apr. 20, 2004

(54) WAFER FOR EVALUATING MACHINABILITY OF PERIPHERY OF WAFER AND METHOD FOR EVALUATING MACHINABILITY OF PERIPHERY OF WAFER

(75) Inventors: Takahiro Hashimoto, Fukushima (JP); Kazutoshi Mizushima, Fukushima (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 239 days.

(21) Appl. No.: 09/914,298

(22) PCT Filed: Dec. 22, 2000

(86) PCT No.: PCT/JP00/09134

§ 371 (c)(1),
(2), (4) Date: Dec. 6, 2001

(87) PCT Pub. No.: WO01/48802

PCT Pub. Date: Jul. 5, 2001

(65) Prior Publication Data

US 2002/0179244 A1 Dec. 5, 2002

(30) Foreign Application Priority Data

Dec. 27, 1999 (JP) .......................................... 11/371655

(51) Int. Cl.$^7$ ................................................. B24B 1/00
(52) U.S. Cl. .......................................... 451/44; 451/8
(58) Field of Search ..................... 216/88, 89; 438/691, 438/692, 693; 451/36, 41, 44, 59, 43, 5, 8

(56) References Cited

U.S. PATENT DOCUMENTS

| | | | | |
|---|---|---|---|---|
| 6,135,863 A | * | 10/2000 | Zhang et al. | 451/56 |
| 6,159,075 A | * | 12/2000 | Zhang | 451/8 |
| 6,171,737 B1 | * | 1/2001 | Phan et al. | 430/30 |
| 6,244,946 B1 | * | 6/2001 | Volodarsky | 451/307 |
| 6,276,997 B1 | * | 8/2001 | Li | 451/41 |
| 6,276,999 B1 | * | 8/2001 | Watanabe et al. | 451/41 |
| 6,352,927 B2 | * | 3/2002 | Kishimoto | 438/690 |
| 6,459,945 B1 | * | 10/2002 | Singh et al. | 451/5 |

* cited by examiner

Primary Examiner—Timothy V. Eley
(74) Attorney, Agent, or Firm—Crowell & Moring LLP

(57) ABSTRACT

Distribution of machining ability in periphery surface is grasped and evaluated through measuring the machined depth at several positions of the peripheral portion by use of a wafer for the evaluation of the ability of machining the peripheral portion thereof.

1 Claim, 3 Drawing Sheets

IMAGE TAKEN BY SCANNING ELECTRON MICROSCOPE OF A WAFER FOR THE EVALUATION OF MACHINING ABILITY BEFORE AND AFTER MACHINING (TEST EXAMPLE)

WAFER FOR EVALUATING MACHINABILITY OF PERIPHERY OF WAFER AND METHOD FOR EVALUATING MACHINABILITY OF PERIPHERY OF WAFER

FIELD OF THE INVENTION

The present invention relates to a wafer used for evaluating the ability of machining the peripheral portion of a wafer and a method of evaluating the ability of machining the peripheral portion of a wafer using said wafer for evaluating said ability.

TECHNICAL BACKGROUND

A semiconductor wafer is, in the process of machining the wafer or in the process of manufacturing devices using the wafer, exposed to frequent machining or handling operations such as automatic transfer using the peripheral portion of the wafer. When the peripheral portion of the disk-like wafer is in the state as cut and accordingly the perihery face is perpendicular to the surface of the wafer, its edges are easily chipped. As a result, the chips adhere to the main surface, etc. to effect as particles to reduce the yield in the succeeding process. Further, if the surface of the peripheral portion is coarse, the chemical substances used in an etching process, etc. is not entirely cleaned off, and the remained chemical substances affect the succeeding process. Still further, in the case of increasing the quality of a wafer by performing epitaxial growing process and the like on the main surface of the single crystal wafer, disadvantages such as the generation of a plurality of protrusions so-called nodules and crowns (jutting crystal growth) are resulted, according to the condition such as surface irregularity and defective crystal arrangement of peripheral portion. Accordingly, in the machining of a wafer, not only the machining of the main surface but also the machining of the peripheral position is important.

It is recently general that the peripheral position is mirror polished to make the highly neat surface of it for preventing chipping in addition to chamfering.

It is naturally necessary, in the process of machining the peripheral position of a wafer, to grasp quantitatively the machining ability to control the process. To be concrete, proper machining is performed through grasping grinding or polishing amount in a span of time. By the conventional evaluation method of the machining ability, the weight of the wafer is measured before and after the machining or at a time halfway through the machining to estimate the reduced thickness of the peripheral position. By this method only average stock removal is determined. The shape of the periphery in a cross section perpendicular to the main surface is not flat as the main surface but designed to have one of several kinds of contours which are generally of convex shape against the face of machining tool, so the contact attitude of the part to be machined to the machining tool surface is not constant. Accordingly, there is a strong tendency that the stock removal during a span of time, that is the machining ability, is different according to the region to be machined of the peripheral portion. In other words, the distribution of machining ability in the region to be machined in the cross section (hereafter referred to as distribution in peripheral surface) is difficult to evaluate. When the machining ability differs according to machined regions, the conventional evaluation of machining ability in average can not be said to be grasping the machining ability rightly.

In the conventional method, as the machining ability is adjusted to match that on the region where the machining speed is the slowest, the periphery is excessively machined as a whole resulting in increased machining time period, leading to reduced productivity and life of the polishing pad and increasing cost.

SUMMARY OF THE INVENTION

The present invention is to solve those problems of the prior art. It is therefore an object of this invention to provide a wafer for the evaluation of the ability of machining the peripheral portion thereof used to measure the distribution of the machining ability along the peripheral portion in the machining of the peripheral portion of the wafer.

Another object of the invention is to provide a method of evaluating the ability of machining the peripheral portion of a water using said wafer for evaluating said machining ability.

A further object of the present invention is to provide a wafer for the evaluation of the ability of machining the peripheral portion of a wafer and a method of measuring said distribution in the cross section to be used for the improvement of the machining process of the wafer peripheral portion, and thus to contribute to better uniformity of machining the peripheral portion.

Namely, the present invention is an evaluation wafer for evaluating the machining ability in the machining process of the peripheral portion of a wafer characterized by having a a reference position to be a boundary with respect to the direction of machining the surface layer of the wafer.

The evaluation of the ability of machining the main surface of a wafer is possible through measuring the change of thickness of the wafer in reference to the other surface of the wafer, but there have been no evaluation method for measuring in length the amount removed by machining because there is no reference position when machining the peripheral portion of the wafer, for the machining is done in the direction of thickness and diameter of the wafer.

This invention makes it possible to measure in length the amount removed by machining the peripheral portion by providing a reference position becoming a boundary with respect to the direction of machining the surface layer of the wafer.

The wafer for evaluation according to the present invention is provided with a reference position to become the boundary with respect to the direction of machining by covering a subtrate with a substance of which the machinability relative to that of the wafer to be machined in the process of machining the peripheral portion is apparent. By this method, the actual machining speed of the wafer is estimated from the machining speed of the evaluation wafer of this invention, which machining speed is of the covered substance, using the relative machinability of the covered substance in relation to the actual wafer to be machined.

The machining ability cited in this invention is defined as the quantity removed by grinding or polishing, or the thickness, or depth ground or polished of the wafer to be machined in a certain condition in unit time. For example, when the thickness of covered polysilicon is $d_0$ before machining and $d_t$ after machining during a time span of t, the machining ability PR is: $PR=(d_0-d_t)/t$. Here, the dimension of $d_0$, $d_t$ is length and that of t is time.

According to the present invention, by measuring at a plurality of positions of the peripheral portion of the wafer, the distribution of machining ability in the surface of the peripheral portion is obtained. On the other hand, the conventional method evaluates the removed quantity by the change in weight. So, when the weight of the wafer is $W_0$ before machining and $W_t$ after machining during a time span of t, the machining ability PR is: $PR=(W_0-W_t)/t$. Here, the dimension of $W_0$, $W_t$ is weight and that of t is time.

As only one value of each of $W_0$ and $W_t$ is obtained per wafer, the conventional method gives only average value of machining ability of a wafer.

It was a conscious choice to explain the machining ability here, for when the term ability is used in a production process, it means, unless particularly specified, the production capacity, that is, the output of the production article per unit time, or the process ability of controlling quality items in a certain value.

As mentioned above, by coating as surface layer a substance of which the relative machinability in relation to a wafer to be machined is known, precice evaluation of machined quantity, i.e. machining ability is possible. To be concrete, it is suitable to cover the single crystal silicon wafer with an oxide film or a polysilicon layer to obtain a wafer for evaluation. Specifically a layer of polysilicon is preferable.

In the case a wafer to be machined is a single crystal silicon wafer, by forming a layer of polysilicon on the surface of the single crystal silicon wafer as the subtrate, a clear boundary between the single crystal and polysilicon is apparent in the cross section. Precice evaluation of machined quantity is possible by taking the position of the boundary as a reference position.

Further, If the polysilicon layer is formed on the mirror-finished surface, specifically on the surface of the peripheral portion of the single crystal silicon wafer, the boundary becomes clearer and more precise evaluation is possible.

To form an oxide film on a single crystal silicon wafer as the base is also effective. In the case of the wafer with an oxide film formed for the evaluation of machining ability, as the machinability of the oxide film is different from that of the production wafer to be machined, it is necessary, as mentioned before, to measure beforehand the relative machinability of the oxide film in relation to that of the wafer to be machined to convert the machinability of the oxide film to that of the wafer to be machined. In the case of polysilicon layer, as its machinability is about the same as a single crystal wafer, precise evaluation of the machinability is possible without conversion.

For the measurement of the distribution of machinability in periphery surface, the evaluation wafer is cut in a method of cleavage or the like the direction perpendicular to the main surface to prepare the sample so that the boundary to be a referene position is clearly apparent in the section. Then, the section is observed by a high magnification means to measure the distance, i.e. the thickness from the reference position to the surface at needed position. A high magnification means capable of observing the actual image of the section and provided with a measuring means of length suffices for the object. Though no specific limitation exists for the magnification device, a scanning electron microscope or the like is preferable.

By the measurement of the thickness or depth machined is obtained at any position and the machining ability can be expressed as a distribution in relation to position.

The present invention contributes to the setting and modification of condition and method through grasping the characteristics of the machining process by using as so-called a monitor the wafer having a reference position to be utilized as a boundary for machining. The wafer itself to be measured is not the production wafer. Therefore, the evaluation is easy if the wafer for the evaluation of machining ability is substantially the same in shape and dimensions as the wafer of which the peripheral portion is machined in the production process.

Further, it is suitable for the same reason that the wafer for the evaluation of machining ability according to the present invention is the same in shape and dimensions as the wafer of which the peripheral portion is machined in the production process at least in the same region to be machined.

Still further, in the case the wafer for the evaluation of machining ability according to the present invention is covered with polysilicon, it is desirable that the thickness of the covering is substantially uniform all around the wafer. When the thickness is uniform, the distribution of machined thickness, or depth in relation to position can be directly compared, although there may be the case the uniformity is not necessary depending on contrivances in measuring method.

Now, when the wafer for the evaluation of machining ability is of polysilicon covered one, the polysilicon layer can be grown on single crystal silicon by an ordinary method. That is: by holding the single crystal silicon wafer in a high temperature furnace where exists in gas state a silicon compound which forms silicon by thermal decomposition or reductive thermal decomposition, polycrystalline silicon deposits and grows up on the single crystal silicon.

In the case the wafer for the evaluation of machining ability according to the present invention is one covered with polysilicon, far thicker polysilicon layer is required than when the purpose is gettering. Although for gettering purpose thickness of 1~1.5 $\mu$m is enough, for the purpose of this invention polysilicon layer is grown to thickness of 5 $\mu$m and over, preferably 10 $\mu$m and over.

Of course, the operation of growing polysilicon can be executed more than once if the desired thickness is not obtained by a single operation.

In machining the peripheral portion of the single crystal silicon wafer, there is the first process in which the unprocessed, disk-like wafer having the periphery face perpendicular to the main surface and accordingly the edges of acute angle is ground by a periphery grinding machine to reduce the periphery face perpendicular to the main surface to such a desired shape as trapezoid or polygon or half-round or other shapes. This process is a so-called chamfering process for grinding the edges of the periphery of the wafer by a grindstone. Then, the chamfered peripheral portion is mirror-polished by a polishing machine in the second process. This process is a so-called mirror-chamfering process in which peripheral portion of the wafer is thrust on a rotating drum with a polishing pad (buff) adhered to it to be polished by a supplied abrasive.

There is also for the purpose of reducing the load of the mirror-chamfering process using a tape with an abrasive affixed to it. The wafer according to the present invention is applicable to either process.

For evaluating the process of mirror-polishing, a wafer for the evaluation of machining ability having substantially the same shape and dimensions as the wafer to be machined is obtained by picking out a production wafer (wafer to be machined) machined in the process and making polysilicon of thickness of about 10 $\mu$m grow on the picked out subtrate of single crystal silicon. The change in dimensions due to the polysilicon of this degree of thickness is about the same as the tolerance of dimensions of the wafer to be machined and the evaluation is possible without influence on machining condition. But, in the case a wafer for the evaluation of machining ability having a still thicker layer of polysilicon, etc. is required due to a larger machining stock removal, it is preferable to make such a contrivance as to reduce the dimensions of the subtrate beforehand to obtain substantially the same dimensions as the wafer to be machined after covered with a layer of polysilicon, etc.

Each of 1~3 shows a machining position, 11 shows a mirror-chamfering apparatus, 12 shows a wafer, 21 shows a sample wafer, and 31 shows a polysilicon layer.

THE BEST FOR CARRYING OUT THE INVENTION

Effect of the present invention will now be detailed wish reference to an example as an embodiment of the present invention and a comparative example implemented according to the prior art. However, it is to be clearly understood that the following description is made only by way of example, and apparatuses, methods, materials, and so forth described in the following shall not be interpreted as limitative of the invention.

(An example of standard machining process for the evaluation using the wafer for the evaluation of peripheral portion machining ability according to the present invention)

Figure 1:
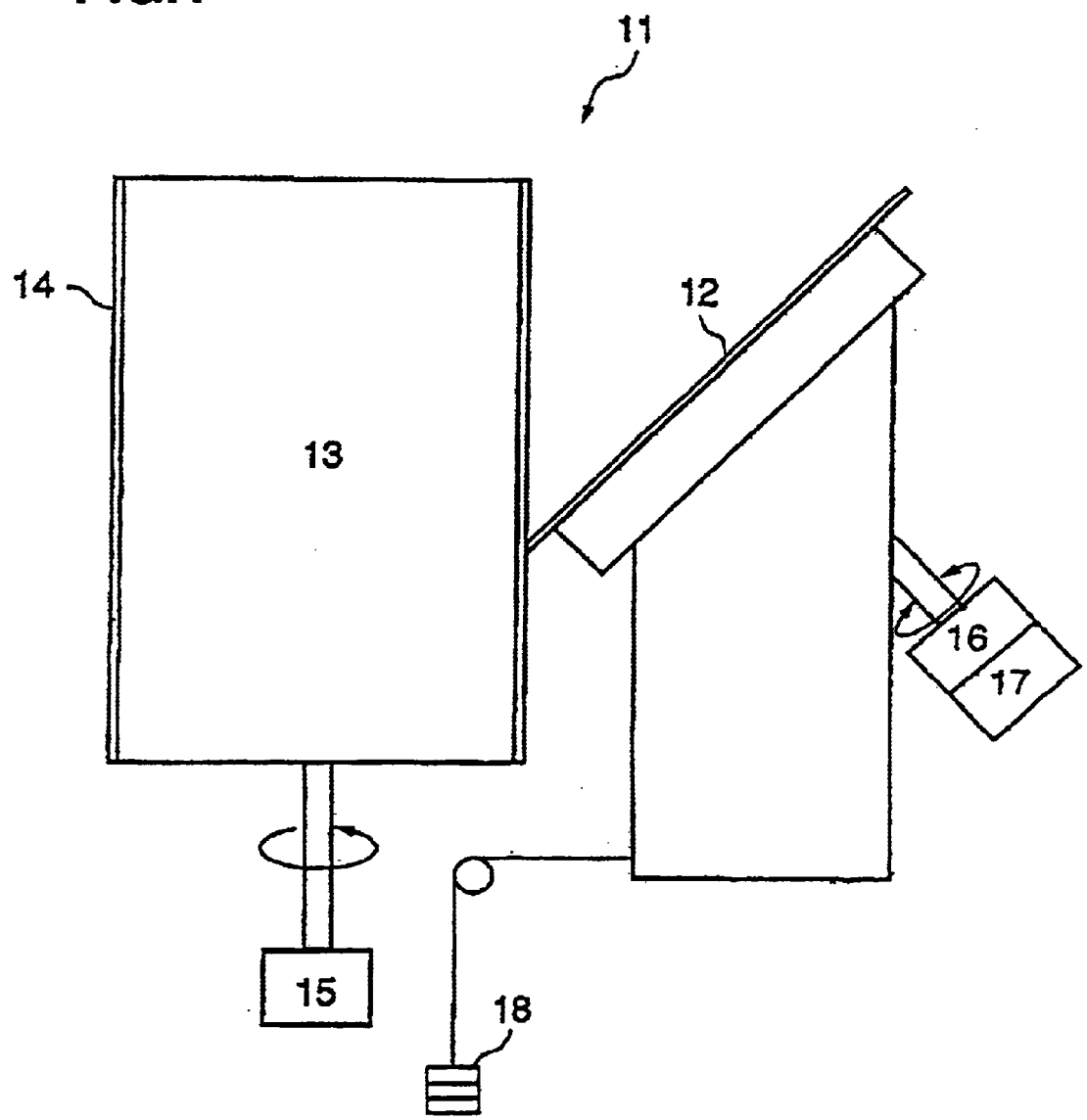
FIG. 1 is a conceptual rendering of the mirror-chamfering apparatus applied to the present invention.

FIG. 1 shows, among machining apparatuses of the peripheral portion of a single crystal silicon wafer, a mirror-chamfering apparatus 11 used for polishing the peripheral portion. In FIG. 1, the peripheral portion of a wafer 12 is polished by maintaining contact at an angle of 45° between the wafer 12 and a drum 13 having a polishing pad (buff) 14 made of non-woven cloth adhered to it. The polishing pad 14 is rubbed all around the peripheral portion of the wafer 12 while pouring a slurry (abrasive of alkaline solution with colloidal silica, etc. dispersed in it) over the contact point. The wafer 12 is rotated at 0.5 rpm while the drum 13 is rotated at 800 rpm. The wafer 12 is thrust against the polishing pad (buff) 14 by the medium of a constant load 18 of 2 kg, as shown in the figure, while polishing. This polishing operation is continued for 240 seconds on the front side and 240 seconds on the rear side. Hereafter, the operation is referred to as standard polishing operation.

Comparative Example 1

Figure 2:
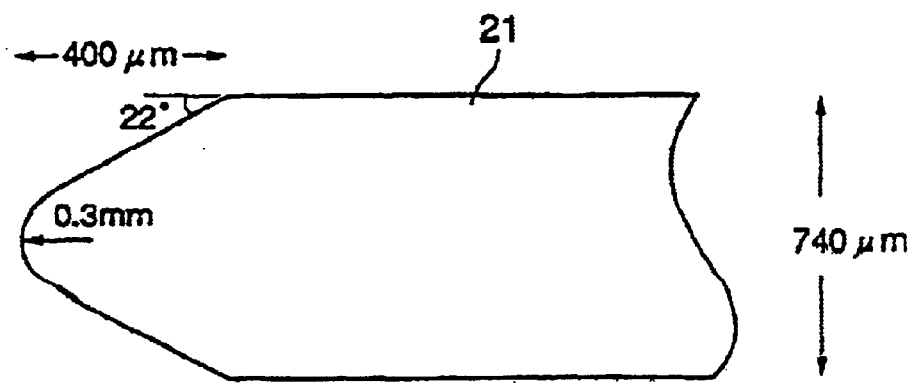
FIG. 2 is a cross sectional view perpendicular to the main surface of a single crystal silicon wafer showing the peripheral portion.

Three sample wafers 21 having the cross-sectional profile of FIG. 2 formed through chamfering by a wafer peripheral portion grinding apparatus were polished by the standard polishing operation. The average difference in weight between the wafer before and after the polishing was 22.4 mg per wafer. The time needed for polishing was 480 seconds per wafer, so the machining ability per unit time, that is, the polishing rate was 2.8 mg/min.

It was recognized that all the part required to be polished had been polished to a mirror surface of the grade acceptable according to the specification of production single silicon wafer through observing the peripheral portion of the polished wafer by a microscope. Based on this evaluation, production was done applying the standard polishing operation of the peripheral portion of a wafer as the initial production condition.

Then planned sampling was done in the peripheral portion polishing process halfway through production to make the similar evaluation as is described above, and the controlling of the production condition such as adjusting of polishing time, change of polishing pad (buff) was executed.

Using this method, differences in polished thickness or polishing depth according to polished positions is not apparent under the microscope. As a result, when using this method, the production condition appropriate for the position on the wafer where the polishing rate is the slowest will be adopted. Therefore, excessive polishing at other wafer positions is inevitable.

EXAMPLE 1

Sample wafers having the cross-sectional profile of FIG. 2 formed through chamfering by a wafer peripheral portion grinding apparatus were placed in a CVD (Chemical Vapor Deposition) apparatus where monosilane is flowed in the chamber of 600~700° C., and a polysilicon layer 31 of 8.3~8.6 μm was uniformly grown on the peripheral portion. Two sample wafers thus covered with polysilicon are prepared.

Figure 3:
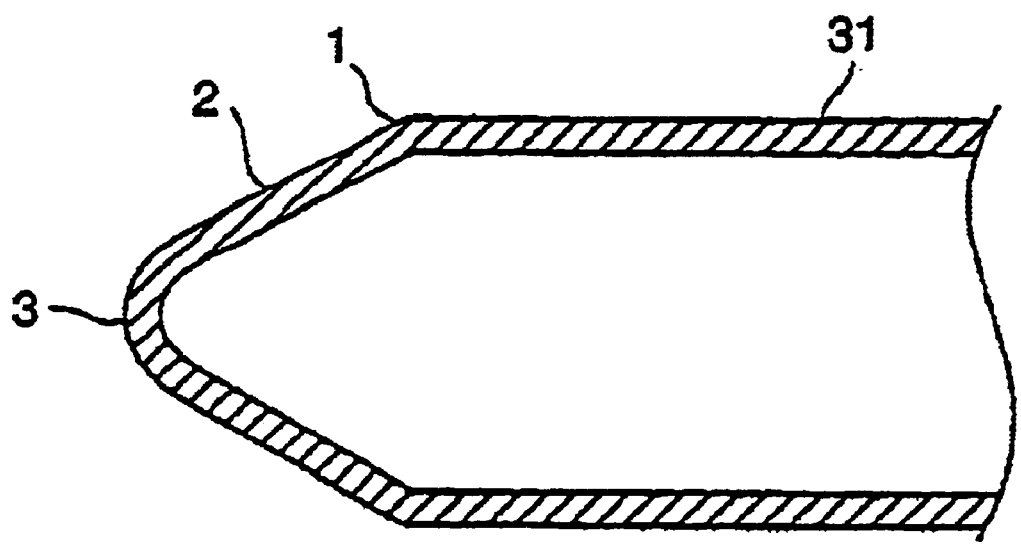
FIG. 3 is a cross sectional view of a wafer covered with polysilicon according to the present invention.

One of them was cleaved perpendicular to the main surface, the cross section was observed by 2000× magnification by use of a scanning electron microscope, and the thickness of the polysilicon layer was measured at position 1, 2, and 3 of FIG. 3 with reference to the boundary clear between the single crystal silicon part and polysilicon part. The value of measurement is shown in Table 1 as $d_{o1}$, $d_{o2}$, and $d_{o3}$. The mirror-polishing was done only on the surface of one side in this example.

Figure 4:
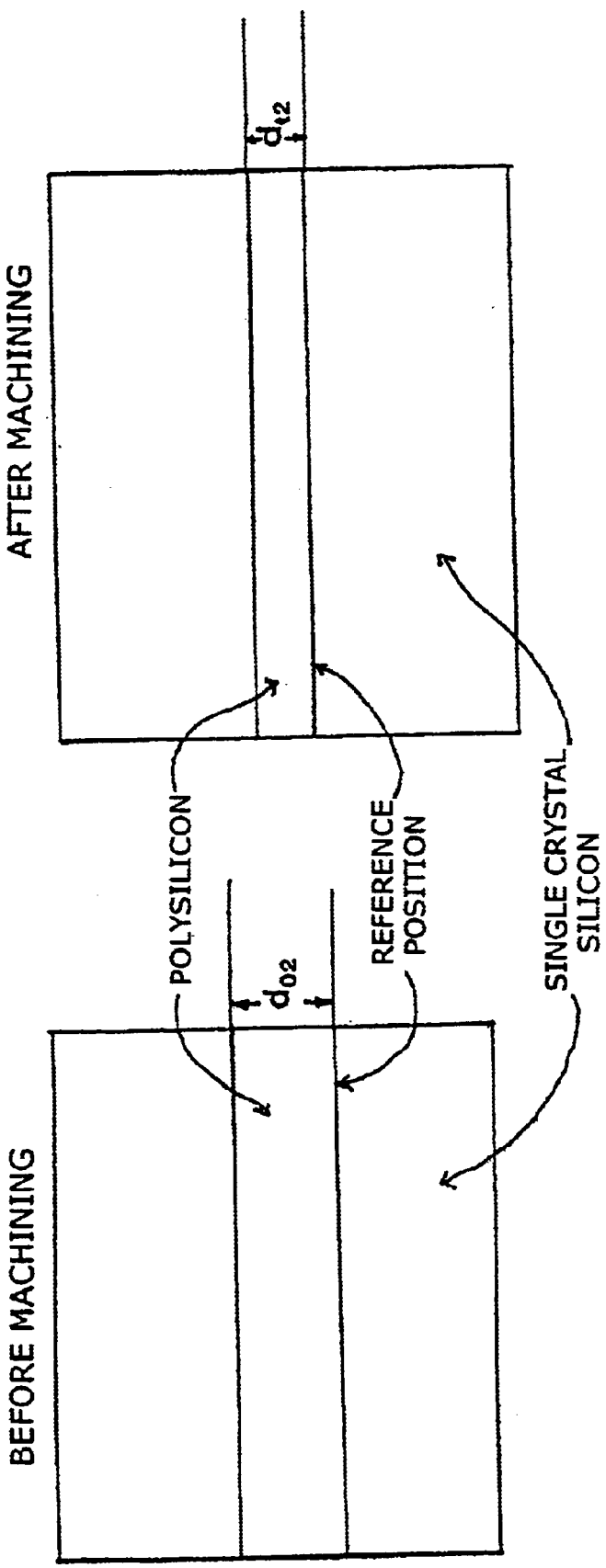
FIG. 4 is a schematic rendering of scanning electron microscope photographs of a measured sample according to the present invention before and after polishing.

Then the peripheral portion of the other wafer was mirror-polished by the standard polishing operation. The thickness of the polysilicon layer was measured at position 1, 2, and 3 in an analogous fashion. FIG. 4 shows scanning electron microscope photographs of position 2 schematically. The value of measurement is shown in Table 1 as $dt_1$, $dt_2$, and $dt_3$.

The difference of thickness before and after polishing at each position, that is, machining ability, is shown in Table 1 as $d_1$, $d_2$, and $d_3$. The result of measurement shows that when the mirror-polishing is performed according to aforementioned standard polishing operation the machining ability (polishing rate) is the lowest at position 3. Actually polishing at position 3 will be done when polishing either the front surface and rear surface, so if both the front and rear surface are polished, the substantial polishing rate will be about two times as large as when a single surface is polished. Accordingly, the polishing rate at position 3 is about the same as that at position 2. It is recognized that the machining ability at position 1 is a little lower compared with that at position 2 and that improvement is required. From the result, it is understood that if the polishing is done in the way in which a uniform distribution of machining ability (polishing rate) is achieved, an improvement in productivity can be attained.

EXAMPLE 2

From the result of test example 1, it turned out that the polishing rate at position 1 is a little lower compared with that at position 2. To improve this, machining ability was measured by mirror-polishing the peripheral portion of the surface of one side of another wafer (a similar wafer as used in test example 1) with the wafer 12 raised further 5°, that is, the surface to be machined is positioned nearer to the drum 13, other conditions being the same as the standard polishing operation. The result was: machining ability (PR) was 1.1 ($\mu$m/min.) at position 1, 1.3($\mu$m/min.) at position 2, and 0.6 ($\mu$m/min.) at position 3.

By reducing the difference in machining ability between position 1 and 2, polishing operation time was reduced by 40 seconds per one face, and silicon wafers of diameter of 200 mm were produced with polishing operation time of 200 seconds for each front surface and 200 seconds for each rear surface. The result was that, in spite of the reduction in polishing time by about 17%, stable production of wafers similar to those of comparative example 1 for comparison was ascertained.

TABLE 1

Measurement value of machining ability on the peripheral portion of wafer

| n | 1 | 2 | 3 |
|---|---|---|---|
| $d_{on}$ | 8.3 | 8.3 | 8.4 |
| $d_{tn}$ | 4.7 | 3.1 | 6.0 |
| $\Delta$ dn | 3.6 | 5.2 | 2.4 |
| PR ($\mu$m/min.) | 0.9 | 1.3 | 0.6 |

Industrial Applicability

As cited above, according to the present invention, a wafer for evaluating the ability of machining the peripheral portion thereof used for measuring the distribution of the machining ability along the peripheral portion in the machining of the peripheral portion of the wafer, and the method of the evaluation are provided. As the distribution of the machining ability along the peripheral portion of the wafer becomes possible, the present invention brings about conspicuous effects such that it contributes to the improvement of uniformity of the machining of the peripheral portion of the wafer.

What is claimed is:

1. A method for evaluating the ability of machining a peripheral portion of a wafer in a wafer peripheral portion machining process comprising:

providing a wafer for evaluating the ability of machining the peripheral portion of the wafer, the wafer having a reference position in the form of a boundary in the direction of machining of a surface of the wafer; and evaluating the machining ability by measuring a thickness from the reference position to said surface before, after, and at a time halfway through the machining, wherein the wafer peripheral portion machining process is a mirror-chamfering process of polishing the peripheral portion of the wafer.

* * * * *